(12) United States Patent
Ueda (10) Patent No.: US 10,873,305 B2
(45) Date of Patent: Dec. 22, 2020

(54) VOLTAGE FOLLOWER CIRCUIT

(71) Applicants: Kabushiki Kaisha Toshiba, Tokyo (JP); Toshiba Electronic Devices & Storage Corporation, Tokyo (JP)

(72) Inventor: Norihiro Ueda, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/292,603

(22) Filed: Mar. 5, 2019

(65) Prior Publication Data

US 2020/0091885 A1 Mar. 19, 2020

(30) Foreign Application Priority Data

Sep. 13, 2018 (JP) ................... 2018-171666

(51) Int. Cl.
*H03F 3/50* (2006.01)
*H03F 3/45* (2006.01)

(52) U.S. Cl.
CPC ......... *H03F 3/505* (2013.01); *H03F 3/45475* (2013.01); *H03F 2200/513* (2013.01); *H03F 2200/69* (2013.01)

(58) Field of Classification Search
CPC .................................................. H03F 3/505
See application file for complete search history.

(56) References Cited

U.S. PATENT DOCUMENTS

| 6,396,329 | B1 * | 5/2002 | Zerbe | G11C 7/02 327/319 |
|---|---|---|---|---|
| 7,102,433 | B2 * | 9/2006 | Lee | H03F 3/3023 330/253 |
| 7,349,681 | B2 * | 3/2008 | Ou | H03K 19/00315 327/530 |
| 7,456,680 | B2 | 11/2008 | Gyohten et al. | |
| 9,152,156 | B2 | 10/2015 | Ueda | |
| 9,466,363 | B2 | 10/2016 | Endoh et al. | |
| 9,571,052 | B1 * | 2/2017 | Trampitsch | H03F 3/45188 |
| 2007/0126505 | A1 * | 6/2007 | Bockelman | H03F 3/2173 330/252 |
| 2007/0216483 | A1 * | 9/2007 | Bhattacharya | H03F 3/45179 330/257 |
| 2009/0085663 | A1 * | 4/2009 | Yang | H03D 7/1458 330/260 |

FOREIGN PATENT DOCUMENTS

| JP | 2005-340337 A | 12/2005 |
|---|---|---|
| JP | 5885683 B2 | 3/2016 |
| JP | 6201259 B2 | 9/2017 |
| WO | 2012-008018 A1 | 1/2012 |

* cited by examiner

*Primary Examiner* — Patricia T Nguyen
(74) *Attorney, Agent, or Firm* — White & Case LLP

(57) ABSTRACT

A voltage follower circuit according to an embodiment includes first and second paths, the first path includes a first nMOS transistor and a first pMOS transistor, the second path includes a second nMOS transistor and a second pMOS transistor, an input voltage is supplied to the gate of the first nMOS transistor, an output voltage is supplied to the gate of the second nMOS transistor, a voltage lower than the output voltage is supplied to the gate of the first pMOS transistor, and a voltage lower than the input voltage is supplied to the gate of the second pMOS transistor.

16 Claims, 8 Drawing Sheets

VOLTAGE FOLLOWER CIRCUIT

CROSS-REFERENCE TO RELATED APPLICATION

This application is based upon and claims the benefit of priority from the prior Japanese Patent Application No. 2018-171666 filed in Japan on Sep. 13, 2018; the entire contents of which are incorporated herein by reference.

FIELD

An embodiment described herein relates generally to a voltage follower circuit.

BACKGROUND

Conventionally, a voltage follower circuit has been widely used in various devices. The voltage follower circuit outputs an output voltage having the same voltage as an input voltage, and is mainly used for impedance conversion and the like.

When a load current of a load to which an output voltage is applied suddenly fluctuates, the response of an amplifier, that is, the slew rate of the amplifier cannot follow, so that the output voltage fluctuates.

In order to keep the fluctuation of the output voltage within a certain level range, it is necessary to increase the slew rate. However, when a large load is driven, the slew rate decreases because the gate capacity of an output buffer increases. Avoiding the decrease of the slew rate causes a problem that a large amount of current must be supplied to a differential amplifier.

DETAILED DESCRIPTION

A voltage follower circuit of an embodiment has a first path for a first differential current and a second path for a second differential current. The first path includes a first nMOS transistor that has a drain connected to a predetermined potential and a gate supplied with an input voltage, and a first pMOS transistor having a drain connected to a potential lower than the predetermined potential. The second path includes a second nMOS transistor that has a drain connected to the predetermined potential and a gate supplied with an output voltage, and a second pMOS transistor having a drain connected to a potential lower than the predetermined potential. The gate of the first pMOS transistor is supplied with a first voltage lower than the output voltage, and the gate of the second pMOS transistor is supplied with a second voltage lower than the input voltage.

The embodiment will be described herein with reference to the drawings.

(Configuration)

Figure 1:
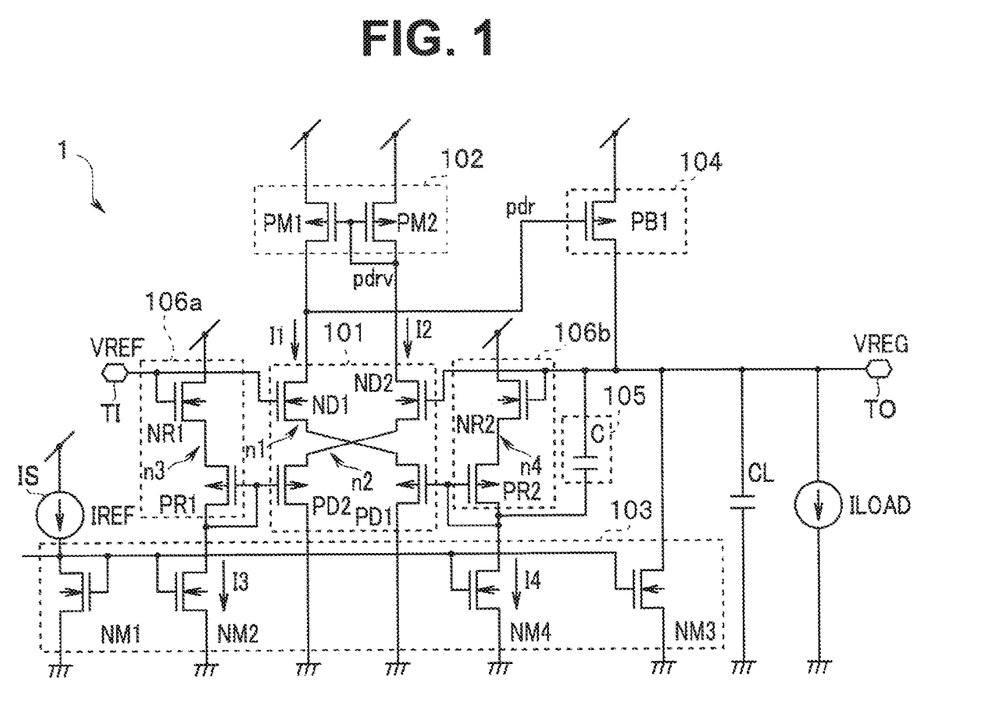
FIG. 1 is a diagram showing a voltage follower circuit according to an embodiment.

FIG. 1 is a diagram showing the voltage follower circuit according to the embodiment.

The voltage follower circuit 1 includes a differential MOS transistor circuit 101, two current mirror circuits 102 and 103, an output buffer 104, a phase compensation circuit 105, and two bias transistor circuits 106a and 106b. In FIG. 1, ILOAD represents a load current, and CL represents a load capacity. The voltage follower circuit 1 is formed, for example, in a chip of a semiconductor integrated circuit.

The differential MOS transistor circuit 101 includes four transistors ND1, ND2, PD1, and PD2. The current mirror circuit 102 is an active current mirror circuit including two transistors PM1 and PM2. The current mirror circuit 103 includes four transistors NM1, NM2, NM3, and NM4. The output buffer 104 includes a transistor PB1. The phase compensation circuit 105 includes a capacitor C. The bias transistor circuit 106a includes two transistors NR1 and PR1. The bias transistor circuit 106b includes transistors NR2 and PR2.

The transistors ND1, ND2, NM1, NM2, NM3, NM4, NR1, and NR2 are n-channel MOS transistors, and the transistors PD1, PD2, PM1, PM2, PR1, and PR2 are p-channel MOS transistors.

The voltage follower circuit 1 has two terminals TI and TO. The voltage follower circuit 1 outputs, to the output terminal TO, an output voltage VREG which is the same voltage as an input voltage VREF supplied to the input terminal TI.

The differential MOS transistor circuit 101 configures a 4-input differential circuit operating as a source follower. The differential MOS transistor circuit 101 has four input terminals connected to the respective gates of the transistors ND1, ND2, PD1, and PD2.

The input voltage VREF is supplied to the gate of the transistor ND1, and the output voltage VREG is supplied to the gate of the transistor ND2.

The input voltage VREF is supplied from the outside. The output voltage VREG is negatively fed back to the differential MOS transistor circuit 101 so as to control a gate voltage pdr of the transistor PB1 according to the load current ILOAD. As a result, the voltage follower circuit 1 outputs a constant output voltage VREG without depending on the load current ILOAD.

That is, the differential nMOS transistor is configured by the transistors ND1 and ND2, and the differential pMOS transistor is configured by the transistors PD1 and PD2.

A first differential current I1 is set by a gate-source voltage of the transistor PD1, and a second differential current I2 is set by a gate-source voltage of the transistor PD2.

Respective drains of the transistors ND1 and ND2 are connected to a predetermined potential, here, VDD, via the current mirror circuit 102 as a load circuit.

The transistor ND1 is a transistor on a positive side of the differential MOS transistor circuit 101, and the transistor ND2 is a transistor on a minus side of the differential MOS transistor circuit 101.

A source of the transistor ND1 is connected to a source of the transistor PD1, and a source of the transistor ND2 is connected to a source of the transistor PD2. The input voltage VREF is applied from the outside to the gate of the transistor ND1. The gate of the transistor ND2 is connected to the output terminal TO. The output voltage VREG is applied to the gate of the transistor ND2.

The respective drains of the transistors ND1 and ND2 are connected to the current mirror circuit 102 as a load circuit. Specifically, the drain of the transistor ND1 is connected to a drain of the transistor PM1, and the drain of the transistor ND2 is connected to a drain of the transistor PM2.

Respective gates of the transistors PM1 and PM2 are connected to the drain of the transistor PM2. The drain of the transistor PM1 is further connected to a gate of the transistor PB1.

A drain of the transistor PB1 is connected to the output terminal TO. The drain potential of the transistor PB1 is fed back to the gate of the transistor ND2.

That is, the output of the output buffer 104 connected to a path PT1 of the first differential current I1 is connected to the respective gates of the transistors ND2 and NR2.

The respective gates of the transistors NM1, NM2, NM3, and NM4 are connected to a drain of the transistor NM1 and a current source IS. The current source IS is a constant current source. Respective sources of the transistors NM1, NM2, NM3, and NM4 are connected to a ground potential.

The drain of the transistor NM2 is connected to a drain of the transistor PR1. The gate of the transistor PD2 is connected to the drain of the transistor PR1.

A drain of the transistor NM3 is connected to the output terminal TO.

A drain of the transistor NM4 is connected to a drain of the transistor PR2. The gate of the transistor PD1 is connected to the gate and the drain of the transistor PR2.

That is, the transistors PR1 and PR2 are driven with a constant current, and a bias voltage is determined.

A gate of the transistor NR1 is connected to the input terminal TI. A source of the transistor NR1 is connected to the source of the transistor PR1. The gate and the drain of the transistor PR1 are connected to each other. The drain of the transistor NR1 is connected to a predetermined potential, here, VDD.

A gate of the transistor NR2 is connected to the output terminal TO. A source of the transistor NR2 is connected to a source of the transistor PR2. The gate and the drain of the transistor PR2 are connected to each other. The drain of the transistor NR2 is connected to a predetermined potential, here, VDD.

The capacitor C is connected to the output terminal TO at one end of the capacitor C, and also connected to the drain of the transistor PR2 at the other end of the capacitor C.

The respective gates of the transistors ND1 and NR1 are connected to the input terminal TI to which the input voltage VREF is input, and the respective gates of the transistors ND2 and NR2 are connected to the output terminal TO from which the output voltage VREG is output.

The transistors ND1, ND2, PD1, PD2, NR1, NR2, PR1, and PR2 operate as source followers.

The current densities of the transistors ND1, ND2, NR1, and NR2 are equal to one another, and the current densities of the transistors PD1, PD2, PR1, and PR2 are also equal to one another. The current density is an amount of current flowing per unit area in one transistor.

Figure 2:
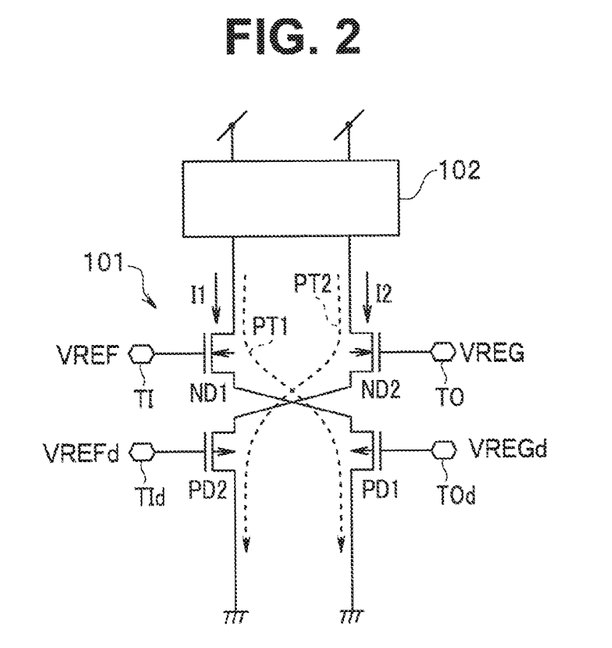
FIG. 2 is a diagram showing a basic configuration of the voltage follower circuit according to the embodiment.
Figure 3:
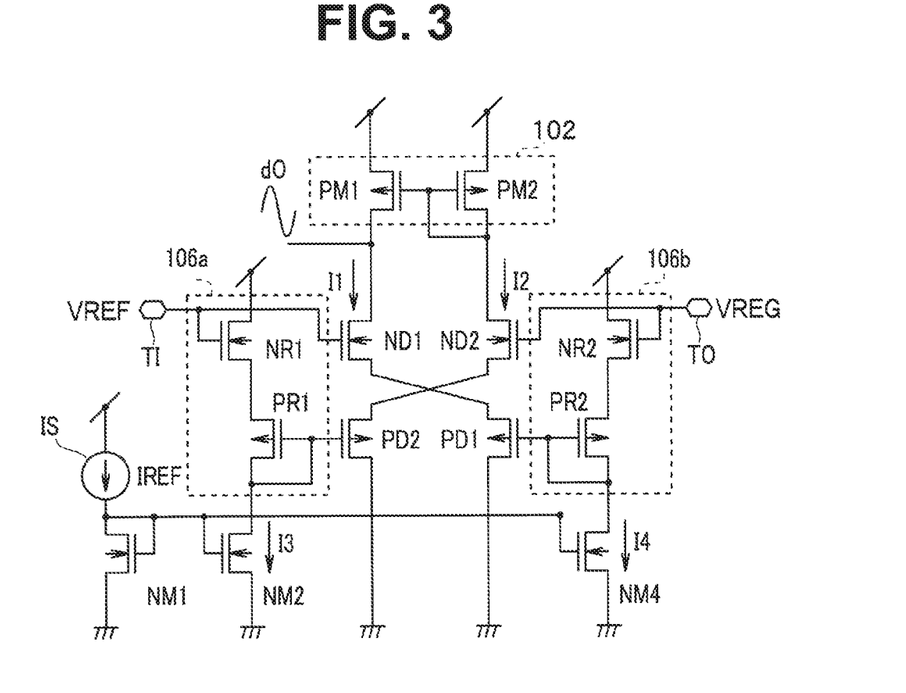
FIG. 3 is a diagram showing a basic configuration of the voltage follower circuit according to the embodiment.

FIGS. 2 and 3 are diagrams showing a basic configuration of the voltage follower circuit 1. FIG. 2 shows only the differential MOS transistor circuit 101 and the current mirror circuit 102. Currents I1 and I2 from the current mirror circuit 102 as a load circuit are supplied to the differential MOS transistor circuit 101.

A voltage VREFd lower than the input voltage VREF is applied to the gate of the transistor PD2, and a voltage VREGd lower than the output voltage VREG is applied to the gate of the transistor PD1. In FIG. 2, the voltage VREFd is applied to an input terminal TId connected to the gate of the transistor PD2, and the voltage VREGd is applied to an input terminal TOd connected to the gate of the transistor PD1.

The voltage VREFd is generated by the bias transistor circuit 106a and the voltage VREGd is generated by the bias transistor circuit 106b.

The bias transistor circuit 106a includes the transistor NR1 and the transistor PR1, sources of the transistor NR1 and the transistor PR1 being connected to each other. The input voltage VREF is applied to the gate of the transistor NR1, and a predetermined potential, here, VDD, is connected to the drain of the transistor NR1.

The gate of the transistor PR1 is connected to the drain of the transistor PR1 and the gate of the transistor PD2, and the drain of the transistor PR1 is connected to the current source IS.

The bias transistor circuit 106b includes the transistor NR2 and the transistor PR2, sources of the transistor NR2 and the transistor PR2 being connected to each other. The output voltage VREG is applied to the gate of the transistor NR2, and a predetermined potential, here, VDD is connected to the drain of the transistor NR2.

The gate of the transistor PR2 is connected to the drain of the transistor PR2 and the gate of the transistor PD1, and the drain of the transistor PR2 is connected to the current source IS.

The voltage follower circuit 1 has a path PT1 for current I1 flowing through the transistors ND1 and PD1, and a path PT2 for current I2 flowing through the transistors ND2 and PD2.

That is, the voltage follower circuit 1 has the path PT1 for the current I1 which is a differential current, and the path PT2 for the current I2 which is a differential current. The path PT1 includes the transistor ND1, the drain of which is connected to a predetermined potential, and the transistor PD1, the drain of which is connected to a potential lower than the predetermined potential. The path PT2 for the current I2 which is the differential current includes the transistor ND2, the drain of which is connected to a predetermined potential, and the transistor PD2, the drain of which is connected to a potential lower than the predetermined potential. Specifically, the respective drains of the transistors ND1 and ND2 are connected to VDD, and the respective drains of the transistors PD1 and PD2 are connected to the ground.

As shown in FIG. 3, the bias transistor circuit 106a is a generating circuit that includes the transistors NR1 and PR1, sources of the transistors NR1 and PR1 being connected to each other, and generates the voltage VREFd having a dependence relationship with the input voltage VREF.

The bias transistor circuit 106b is a generating circuit that includes the transistors NR2 and PR2, sources of the transistors NR2 and PR2 being connected to each other, and generates the voltage VREGd having a dependency relationship with the output voltage VREG.

Note that the voltage follower circuit 1 has a single output dO configured to provide the voltage pdr to the output buffer 104 as shown in FIG. 3.

(Operation)

Next, the operation of the voltage follower circuit 1 will be described.

Note that in the following description, the differential currents flowing through the transistors ND1 and PD1 are represented by I1, the differential currents flowing through the transistors ND2 and PD2 are represented by I2, the currents flowing through the transistors NM2, NR1 and PR1 are represented by I3, and currents flowing through the transistors NM4, NR2 and PR2 are represented by I4.

The gate voltage of the transistor PB1 is represented by pdr, and the reference current of the current source IS is represented by IREF.

The potential of a source node n1 of the transistors ND1 and PD1 is represented by Vn1, the potential of a source node n2 of the transistors ND2 and PD2 is represented by Vn2, the potential of a source node n3 of the transistors NR1 and PR2 is represented by Vn3, and the potential of a source node n4 of the transistors NR2 and PR2 is represented by Vn4.

(1) For VREF=VREG

For VREF=VREG, the differential MOS transistor circuit 101 keeps the balance. That is, when the voltages of the input terminal TI and the output terminal TO are equal to each other, the current densities of the transistors ND1, ND2, NR1, and NR2 are equal to one another, and the current densities of the transistors PD1, PD2, PR1, and PR2 are equal to one another, so that potentials Vn1, Vn2, Vn3, and Vn4 of the source nodes n1, n2, n3 and n4 are equal to one another. That is, Vn1=Vn2=Vn3=Vn4 is satisfied.

For example, assuming that I3=I4 is satisfied, the current flowing through the transistor PM1 is represented by I1 and the current flowing through the transistor PM2 is represented by I2, the currents I1 and I2 are expressed by the following equations.

$$I1 = A1 \times I3 = B1 \times I4$$

$$I2 = A2 \times I4 = B2 \times I3$$

Here, A1 represents the ratio (I(ND1)/I(NR1)) of the current I(ND1) flowing through the transistor ND1 to the current I(NR1) flowing through the transistor NR1. B1 represents the ratio (I(PD1)/I(PR2)) of the current I(PD1) flowing through the transistor PD1 to the current I(PR2) flowing through the transistor PR2. A2 represents the ratio (I(ND2)/I(NR2)) of the current I(ND2) flowing through the transistor ND2 to the current I(NR2) flowing through the transistor NR2. B2 represents the ratio (I(PD2)/I(PR1)) of the current I(PD2) flowing through the transistor PD2 to the current I(PR1) flowing through the transistor PR1.

(2) For VREF>VREG

For VREF>VREG, the differential MOS transistor circuit 101 operates so as to reduce the voltage pdr and cause the transistor PB1 to supply current to the load.

Since the transistor ND2 operates as a source follower, the potential of the source node n2 decreases by only Δ(VREF−VREG). Therefore, the gate-source voltage Vgs of the transistor PD2 operating as a source follower decreases by only Δ(VREF−VREG), so that the current I2 in the path PT2 decreases.

Furthermore, since the transistors NR2 and PR2 operate as source followers, the gate voltage of the transistor PD1 decreases according to Δ(VREF−VREG). In addition, the gate voltage of the transistor PD1 varies depending on the output voltage VREG by the capacitor C serving as both a speed-up capacitor and a phase compensation capacitor. That is, the gate voltage of the transistor PD1 decreases depending on the output voltage VREG and becomes the voltage VREGd lower than the output voltage VREG. Accordingly, the respective gate-source voltages Vgs of the transistors PD1 and ND1 increase, so that the current I1 in the path PT1 increases.

That is, in the differential MOS transistor circuit 101, when the output voltage VREG falls below the input voltage VREF, the current I1 increases, and the current I2 decreases. Therefore, the voltage pdr decreases, and the gate-source voltage Vgs of the transistor PB1 increases. The transistor PB1 operates to supply current to the load to be supplied with the output voltage VREG.

(3) For VREF<VREG

For VREF<VREG, the differential MOS transistor circuit 101 operates so as to increase the voltage pdr and cause the transistor PB1 to cut off the current to the load.

Since the transistor ND2 operates as a source follower, the potential of the source node n2 increases by only Δ(VREF−VREG). Therefore, the gate-source voltage Vgs of the transistor PD2 operating as a source follower increases by only Δ(VREF−VREG), so that the current I2 increases.

Since the transistors NR2 and PR2 are operating as a source follower, the gate voltage of the transistor PD1 increases according to Δ(VREF−VREG). Furthermore, the gate voltage of the transistor PD1 varies depending on the output voltage VREG by the capacitor C serving for both of speed-up and phase compensation. That is, the gate voltage of the transistor PD1 increases depending on the output voltage VREG. Accordingly, the respective gate-source voltages Vgs of the transistors PD1 and ND1 decrease, so that the current I1 decreases.

That is, in the differential MOS transistor circuit 101, when the output voltage VREG increases beyond the input voltage VREF, the current I2 increases and the current I1 decreases. Therefore, the gate voltage pdrv of the transistors PM1 and PM2 decreases. Therefore, the gate-source voltage Vgs of the transistor PM1 increases, so that the voltage pdr increases. Therefore, the gate-source voltage Vgs of the transistor PB1 decreases. The transistor PB1 operates to cut off so that no current flows through the load to be supplied with the output voltage VREG.

As described above, the voltage follower circuit 1 actively amplifies the differential currents I1 and I2 of the differential MOS transistor circuit 101 so that the input voltage VREF and the output voltage VREG are equal to each other. Therefore, when a potential difference exists between the input voltage VREF and the output voltage VREG, the output voltage VREG is output at a high slew rate.

When the input voltage VREF and the output voltage VREG are equal to each other, a constant current flows, so that power consumption of the circuit does not increase.

Therefore, according to the present embodiment, it is possible to provide a voltage follower circuit that can output an output voltage at a high slew rate when any difference occurs between the input voltage and the output voltage.

Particularly, according to the voltage follower circuit of the present embodiment, the voltage follower circuit can amplify the current to the load only when an input/output voltage difference occurs, can output the output voltage at a high speed and with high precision, does not increase current consumption when the circuit is stabilized, and can operate with a constant current when the circuit is stabilized.

Various modifications of the above-described embodiment will be described herein.

In the above-described voltage follower circuit, the respective transistors operate in a strong inversion region, but some of the transistors may operate in a weak inversion region.

That is, in the voltage follower circuit 1, the transistors ND1, ND2, NR1, and NR2 which are nMOS transistors, or the transistors PD1, PD2, PR1, and PR2 which are pMOS transistors may be caused to operate in the weak inversion region. Alternatively, in the above-described voltage follower circuit 1, the transistors ND1, ND2, NR1, and NR2 and the transistors PD1, PD2, PR1, and PR2 may be caused to operate in the weak inversion region.

Note that the reference current IREF of the current source IS has a plus temperature characteristic in order to supplement a current amplification factor of the weak inversion region which deteriorates at a high temperature. That is, the current source IS is a constant current circuit having a plus temperature gradient characteristic.

Figure 4:
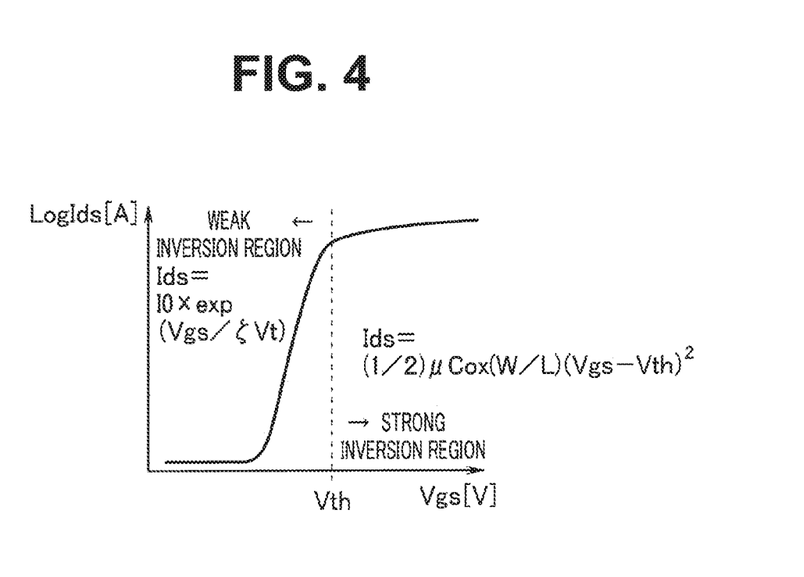
FIG. 4 is a graph showing an operation of a transistor in a weak inversion region according to the embodiment.

FIG. 4 is a graph showing the operation of a transistor in a weak inversion region.

A horizontal axis of FIG. 4 represents a gate-source voltage Vgs (V), and a vertical axis represents a LOG value (Log Ids) (A) of the current Ids flowing between the drain and the source.

In a strong inversion region in which the gate source voltage Vgs(V) is not less than a threshold value Vth of the transistor, the drain current Id of the transistor has a value expressed by the following equation (1).

$$Ids = (1/2) \times \mu Cox \times (W/L) \times (Vgs - Vth)^2 \quad (1)$$

Here, μ represents the mobility of electrons in a semiconductor, Cox represents the capacitance per unit area of an MOS capacitor, W represents a gate width, and L represents a gate length.

In a weak inversion region in which the gate-source voltage Vgs(V) is not more than the threshold value Vth of the transistor, the drain-source current Ids of the transistor has a value expressed by the following equation (2).

$$Ids = I0 \times \exp(Vgs/\zeta \times Vt) \quad (2)$$

Here, I0 represents a subthreshold leak current when the gate-source voltage Vgs is equal to 0, ζ (zeta) represents a slope coefficient, and Vt represents a thermal voltage.

As shown in FIG. 4, when the gate-source voltage Vgs (V) increases, the drain-source current Ids of the transistor operating in the weak inversion region exponentially increases.

Accordingly, by causing the transistors ND1, ND2, NR1, NR2, PD1, PD2, PR1, and PR2 to operate in the weak inversion region, or causing the transistors ND1, ND2, NR1, and NR2 or the transistors PD1, PD2, PR1, and PR2 to operate in the weak inversion region, current change with respect to voltage change of Δ(VREF−VREG) is amplified. As a result, the voltage follower circuit 1 can be operated at a higher speed.

For VREF>VREG, the current I1 has a value expressed by the following equation (3) with respect to the voltage change of Δ(VREF−VREG), and the current I2 has a value expressed by the following equation (4).

$$I1 = \exp(Vgs/\zeta \times Vt) \quad (3)$$

$$I2 = -\exp(Vgs/\zeta \times Vt) \quad (4)$$

Accordingly, for VREF>VREG, the current I1 is exponentially amplified according to the voltage change of Δ(VREF−VREG), and the current I2 decreases exponentially.

For VREF<VREG, the current I2 has a value expressed by the following equation (5) with respect to voltage change of Δ(VREF−VREG), and the current I1 has a value expressed by the following equation (6).

$$I2 = \exp(Vgs/\zeta \times Vt) \quad (5)$$

$$I1 = -\exp(Vgs/\zeta \times Vt) \quad (6)$$

Accordingly, for VREF<VREG, the current I2 is exponentially amplified according to the voltage change of Δ(VREF−VREG), and the current I1 decreases exponentially.

Figure 5A:
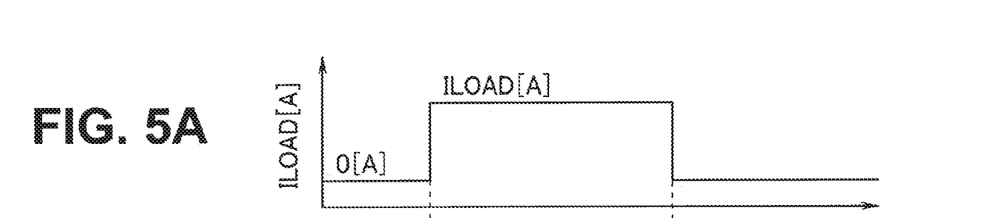
FIGS. 5A and 5B are graphs showing fluctuation of an output voltage for a step response of a load current of the voltage follower circuit according to the embodiment.
Figure 5B:
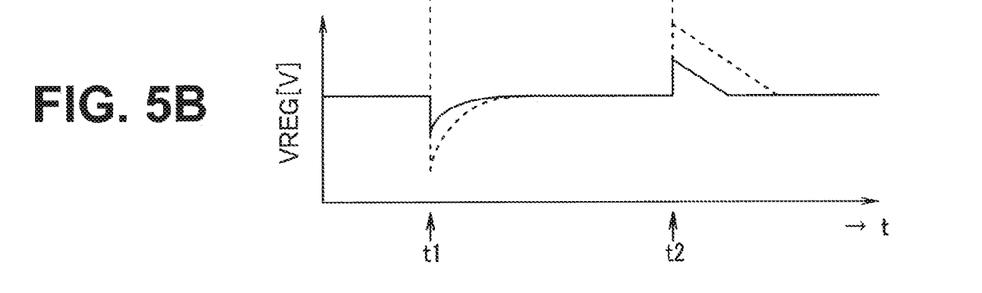

FIGS. 5A and 5B are graphs showing variation of the output voltage VREG with respect to the step response of the load current ILOAD of the voltage follower circuit 1. FIG. 5A shows variation of the load current ILOAD with lapse of time, and FIG. 5B shows variation of the output voltage VREG with lapse of time.

When the load current ILOAD abruptly increases and the output voltage VREG decreases at a time t1, the current I11 steeply increases. The current I1 causes the gate voltage pdr of the transistor PB1 to decrease faster than the gate voltage pdr in the case of the conventional voltage follower circuit. The output voltage VREG increases faster in the present embodiment as indicated by a solid line than the output voltage VREG in the case of the conventional voltage follower circuit (indicated by a dotted line).

On the other hand, when the load current ILOAD abruptly decreases and the output voltage VREG increases at a time t2, the current I2 steeply increases. As a result, the current I1 also increases. The increase of the current I1 causes the gate voltage pdr of the transistor PB1 to increase faster than the gate voltage pdr in the case of the conventional voltage follower circuit. The output voltage VREG decreases faster as indicated by a solid line in the present embodiment than the output voltage VREG in the case of the conventional voltage follower circuit (indicated by a dotted line).

Accordingly, by operating the differential transistor in the weak inversion region, it is possible to further speed up the amplification of the current with respect to the voltage difference.

Although the back gate voltage is not particularly limited in the above-described embodiment, the back gate voltages of the transistors ND1, ND2, NR1, NR2, PD1, PD2, PR1, and PR2 are set to midpoint potentials which reduce the threshold values Vth of the respective transistors.

Figure 6:
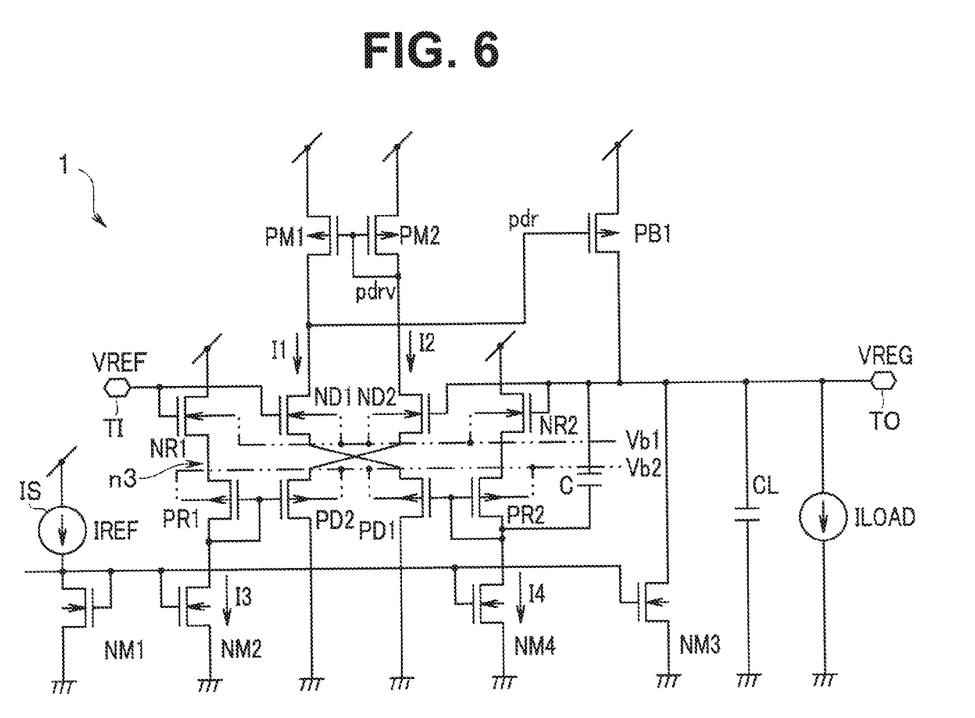
FIG. 6 is a diagram showing a voltage follower circuit in which back gate voltages of eight transistors are set to midpoint potentials according to the embodiment.

FIG. 6 is a diagram showing a voltage follower circuit in which the back gate voltages of the eight transistors ND1, ND2, NR1, NR2, PD1, PD2, PR1, and PR2 are set to midpoint potentials.

As indicated by a two-dot chain line, the back gate voltages of the transistors ND1, ND2, NR1, and NR2 which are nMOS transistors are set to a midpoint potential Vb1, and the back gate voltages of the transistors PD1, PD2, PR1, and PR2 which are pMOS transistors are set to a midpoint potential Vb2.

In the case of the pMOS transistor, when the back gate voltage of the transistor becomes higher than the voltage of the source node, the threshold value Vth of the transistor also becomes high, and thus the transistor may not turn on. In the case of the nMOS transistor, when the back gate voltage of the transistor becomes lower than the voltage of the source node, the threshold value Vth of the transistor also becomes high, and thus the transistor may not turn on. Therefore, the back gate voltage of each transistor is set to a predetermined value so that the ranges of the input voltage and the output voltage can operate even at a low voltage.

For example, when the potential of the source node n3 is applied to the back gate of each transistor so that each transistor properly turns on, the threshold value Vth of each transistor decreases and the input range of the input voltage VREF can be extended to a low voltage side.

Furthermore, in the voltage follower circuit of the above-described embodiment, the transistor PB1 is a pMOS transistor, but the transistor PB1 may be configured by an nMOS transistor.

Figure 7:
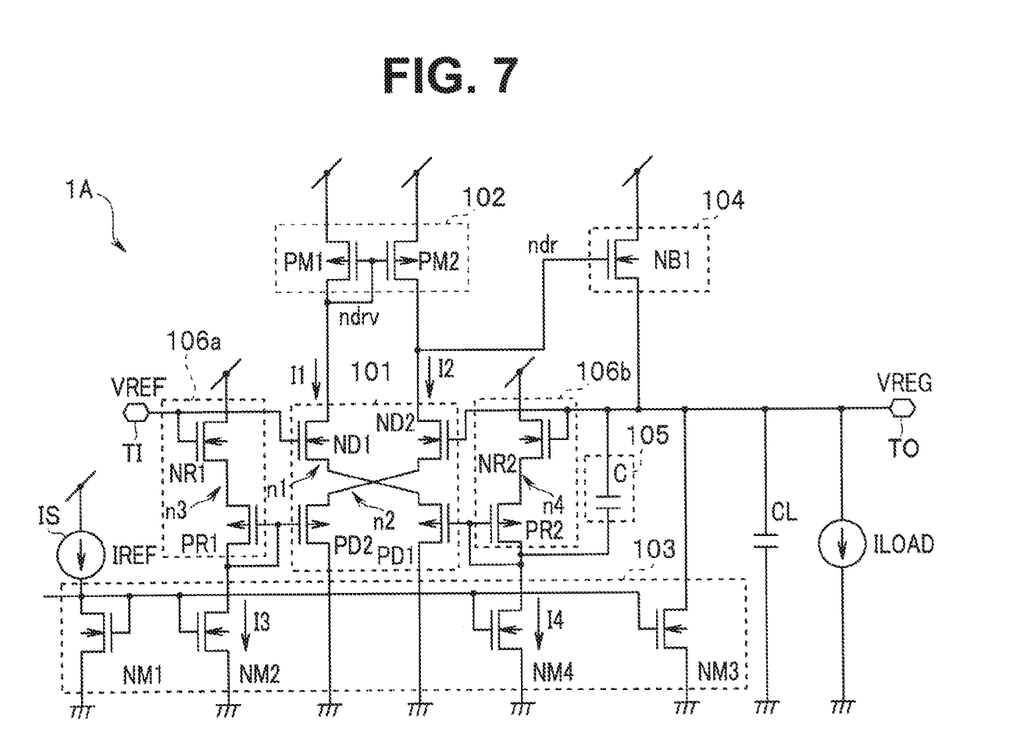
FIG. 7 is a diagram showing a voltage follower circuit in which an output buffer is configured by nMOS transistors according to the embodiment.

FIG. 7 is a diagram showing a voltage follower circuit IA in which the output buffer is configured by nMOS transistors. In the circuit shown in FIG. 7, description on the same elements as the circuit elements shown in FIG. 1 is omitted.

The transistor NB1 of the output buffer 104 is configured by an nMOS transistor, and a voltage ndr of the drain of the transistor ND2 is applied to the gate of the transistor NB1. The output of the output buffer 104 connected to the path PT2 is connected to the gate of the transistor ND2 and the gate of the transistor NR2. Here, the source of the transistor NB1 is connected to the gate of the transistor ND2 and the gate of the transistor NR2.

Since the output buffer 104 is configured by the nMOS transistors, a faster voltage follower circuit can be realized.

In this case, the gate and the drain of the transistor PM1 of the current mirror circuit 102 as the load circuit are connected to each other, and the drain of the transistor PM1 is set to the gate voltage ndrv.

Furthermore, in the voltage follower circuit 1, the current mirror circuit 102 is used as the load circuit, but an on-resistance of a transistor or a resistor may be used as the load circuit.

Figure 8:
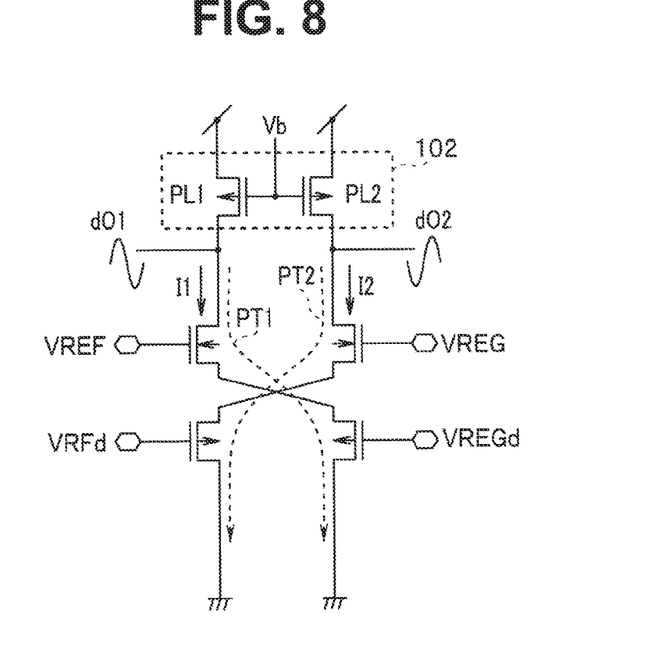
FIG. 8 is a diagram showing a load circuit having two transistors according to the embodiment.

FIG. 8 is a diagram showing a load circuit having two transistors. A pMOS transistor PL1 is provided in the path PT1 through which the current I1 flows, and a pMOS transistor PL2 is provided in the path PT 2 through which the current I2 flows. Gates of the transistors PL1 and PL2 are connected to each other, and a predetermined potential Vb is applied to the gates of the transistors PL1 and PL2. In this case, the voltage follower circuit 1 has differential outputs dO1 and d02. Therefore, voltages corresponding to the on-resistances of the transistors PL1 and PL2 are generated at dO1 and dO2.

Figure 9:
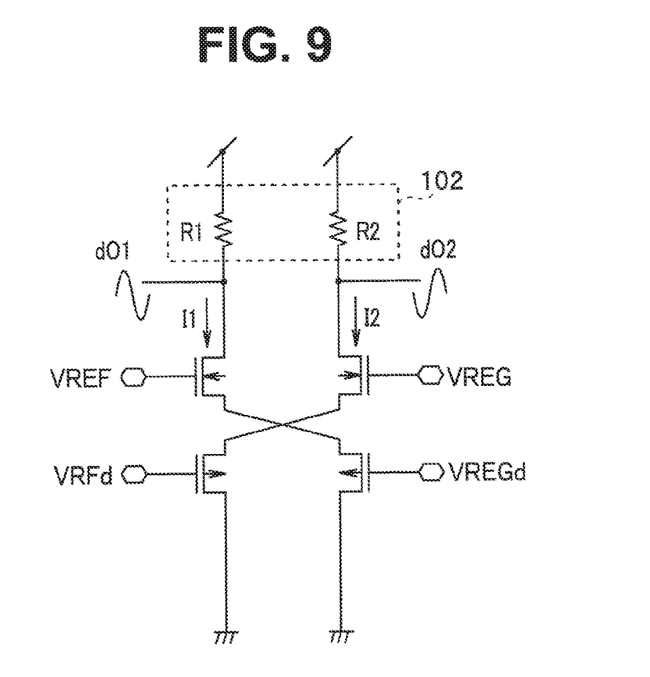
FIG. 9 is a diagram showing a load circuit having two resistors according to the embodiment.

FIG. 9 is a diagram showing a load circuit having two resistors. A resistor R1 is provided in the path PT1 through which the current I1 flows, and a resistor R2 is provided in the path PT2 through which the current I2 flows. Therefore, voltages corresponding to the resistors R1 and R2 are generated at dO1 and d02.

Furthermore, the respective drains of the transistors PR1 and PR2 are connected to the current source IS which is a constant current source, but may be connected to resistors.

Figure 10:
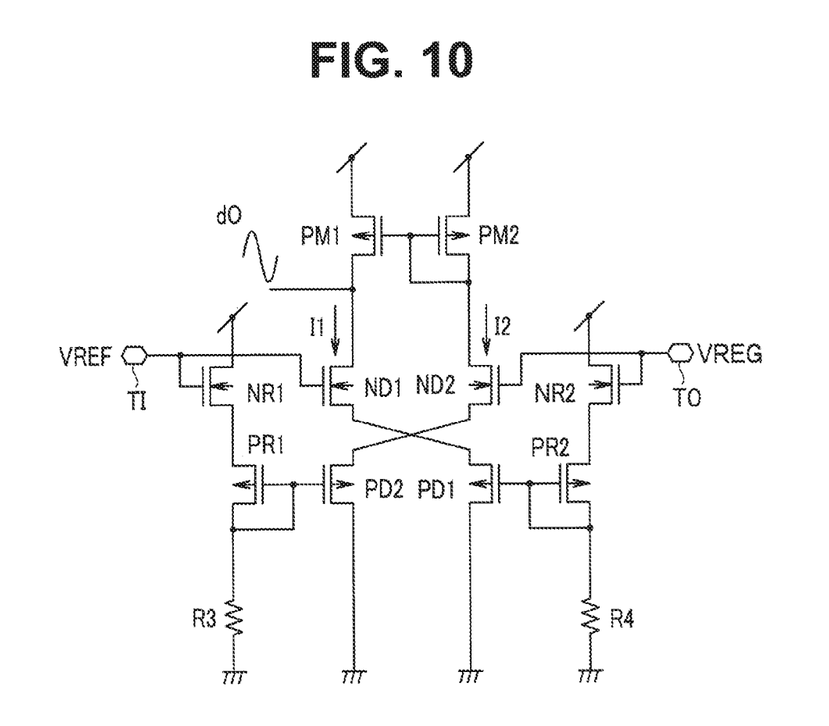
FIG. 10 is a diagram showing a voltage follower circuit in which each drain of two transistors is connected to a resistor according to the embodiment.

FIG. 10 is a diagram showing a voltage follower circuit in which the respective drains of the transistors PR1 and PR2 are connected to resistors.

The drain of the transistor PR1 and the drain of the transistor PR2 are connected to a resistor R3 and a resistor R4, respectively.

That is, the drain of the transistor PR1 is grounded via the resistor R3, and the drain of the transistor PR 2 is grounded through the resistor R4.

In the voltage follower circuit of FIG. 10, bias voltages of the transistors PR1 and PR2 can be set without requiring any constant current circuit.

Note that the circuit of the above-described embodiment can also be used as a comparator circuit.

Figure 11:
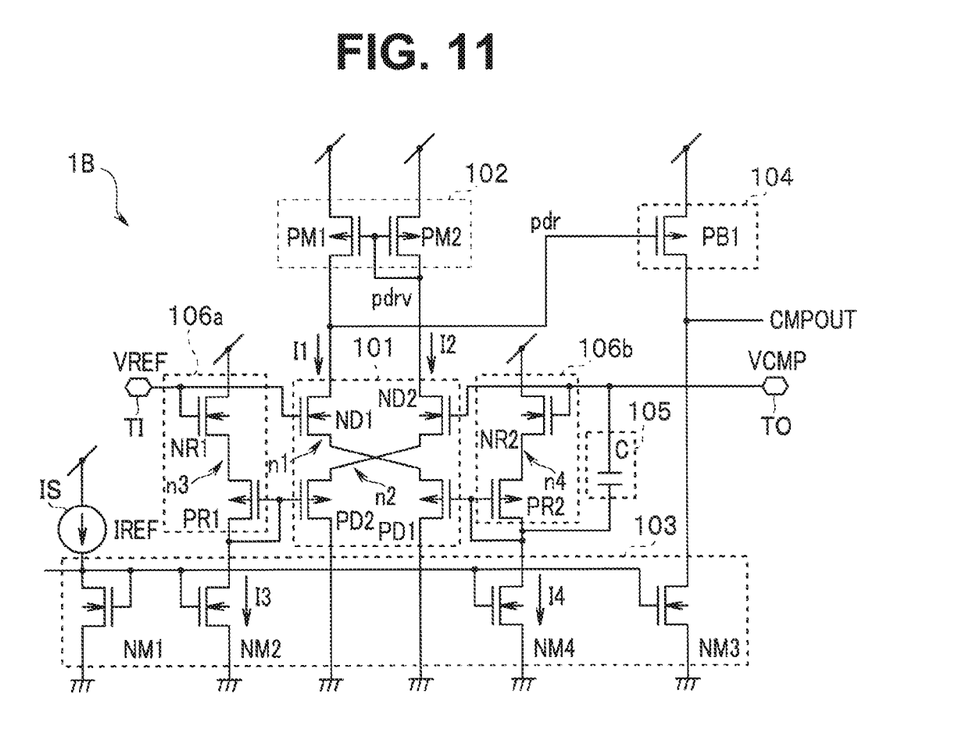
FIG. 11 is a diagram showing a comparator circuit.

FIG. 11 is a diagram showing a comparator circuit. The comparator circuit also responds quickly.

In FIG. 11, the same elements as the elements shown in the voltage follower circuit 1 in FIG. 1 are represented by the same reference signs, and description on the elements is omitted. The drain of the transistor PB1 is connected to the drain of the nMOS transistor NM3. The drain voltage of the transistor PB1 is not fed back.

The input voltage VREF to be compared is applied to the input terminal TI, a reference voltage VCMP as a comparison target is applied to the output terminal TO, and a connection point between the drain of the transistor PB1 and the drain of the transistor NM3 serves as a comparison output CMPOUT.

When the input voltage VREF is higher than the reference voltage VCMP, the comparison output CMPOUT becomes LOW, and when the input voltage VREF is lower than the reference voltage VCMP, the comparison output CMPOUT becomes HIGH.

Therefore, a comparator can be configured by using the circuit of the above-described embodiment.

As described above, according to the above-described embodiment, it is possible to provide a voltage follower circuit capable of outputting an output voltage at a high slew rate when a difference occurs between the input voltage and the output voltage.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A voltage follower circuit comprising a first path for a first differential current and a second path for a second differential current, wherein
 the first path includes a first nMOS transistor having a drain connected to a predetermined potential and a gate supplied with an input voltage, and a first pMOS transistor having a drain connected to a potential lower than the predetermined potential,
 the second path includes a second nMOS transistor having a drain connected to the predetermined potential and a gate supplied with an output voltage, and a second pMOS transistor having a drain connected to a potential lower than the predetermined potential,
 the first pMOS transistor has a gate to which a first voltage lower than the output voltage is supplied, and
 the second pMOS transistor has a gate to which a second voltage lower than the input voltage is supplied, and wherein
 the voltage follower circuit further comprises a capacitor having one end connected to the gate of the first pMOS transistor and another end connected to an output terminal of the output voltage, the capacitor being configured to vary a gate voltage of the first pMOS transistor depending on the output voltage.

2. The voltage follower circuit according to claim 1, wherein a differential nMOS transistor is configured by the first nMOS transistor and the second nMOS transistor, and a differential pMOS transistor is configured by the first pMOS transistor and the second pMOS transistor.

3. The voltage follower circuit according to claim 1, wherein
a source of the first nMOS transistor and a source of the first pMOS transistor are connected to each other to configure the first path, and
a source of the second nMOS transistor and a source of the second pMOS transistor are connected to each other to configure the second path.

4. The voltage follower circuit according to claim 1, wherein the first differential current is set by a gate-source voltage of the first pMOS transistor, and the second differential current is set by a gate-source voltage of the second pMOS transistor.

5. The voltage follower circuit according to claim 1, further comprising a first generating circuit for generating the first voltage, and a second generating circuit for generating the second voltage.

6. The voltage follower circuit according to claim 4, wherein
the second generating circuit includes a third nMOS transistor and a third pMOS transistor, sources of the third nMOS transistor and the third pMOS transistor being connected to each other,
the third nMOS transistor has a gate to which the input voltage is applied, and a drain connected to the predetermined potential,
the third pMOS transistor has a gate connected to a drain of the third pMOS transistor and the gate of the second pMOS transistor, the drain of the third pMOS transistor being connected to a constant current circuit,
the first generating circuit includes a fourth nMOS transistor and a fourth pMOS transistor, sources of the fourth nMOS transistor and the fourth pMOS transistor being connected to each other,
the fourth nMOS transistor has a gate to which the output voltage is applied, and a drain connected to the predetermined potential, and
the fourth pMOS transistor has a gate connected to a drain of the fourth pMOS transistor and the gate of the first pMOS transistor, the drain of the fourth pMOS transistor being connected to the constant current circuit.

7. The voltage follower circuit according to claim 6, wherein back gate voltages of the first to fourth nMOS transistors are set to a first midpoint potential, and back gate voltages of the first to fourth pMOS transistors are set to a second midpoint potential.

8. The voltage follower circuit according to claim 1, further comprising an output buffer connected to the first path or the second path, wherein an output of the output buffer is connected to the gate of the second nMOS transistor.

9. The voltage follower circuit according to claim 8, wherein
the output buffer includes a fifth pMOS transistor, and
the fifth pMOS transistor has a drain connected to the gate of the second nMOS transistor and the gate of the fourth nMOS transistor.

10. The voltage follower circuit according to claim 8, wherein
the output buffer includes a fifth nMOS transistor, and
the fifth nMOS transistor has a source connected to the gate of the second nMOS transistor and the gate of the fourth nMOS transistor.

11. The voltage follower circuit according to claim 6, wherein the constant current circuit has a temperature characteristic of a plus temperature gradient.

12. The voltage follower circuit according to claim 1, wherein the first and second nMOS transistors or the first and second pMOS transistors operate in a weak inversion region.

13. The voltage follower circuit according to claim 1, wherein the drain of the first nMOS transistor and the drain of the second nMOS transistor are connected to the predetermined potential via a load circuit.

14. The voltage follower circuit according to claim 1, wherein a drain of the third pMOS transistor and a drain of the fourth pMOS transistor are connected to a first resistor and a second resistor, respectively.

15. The voltage follower circuit according to claim 6, further comprising:
a fifth nMOS transistor having a gate connected to the constant current source, a source being grounded, and a drain connected to the drain of the third pMOS transistor; and
a sixth nMOS transistor having a gate connected to the constant current source, a source being grounded, and a drain connected to the drain of the fourth pMOS transistor.

16. The voltage follower circuit according to claim 15, further comprising:
a seventh nMOS transistor having a gate and a drain that are connected to the constant current source, and a source being grounded; and
an eighth nMOS transistor having a gate connected to the constant current source, a source being grounded, and a drain connected to the output voltage.

* * * * *